(12) United States Patent
Wang et al.

(10) Patent No.: US 8,519,462 B2
(45) Date of Patent: Aug. 27, 2013

(54) 6F2 DRAM CELL

(75) Inventors: Yih Wang, Portland, OR (US); M. Clair Webb, Aloha, OR (US); Nick Lindert, Portland, OR (US); Swaminathan Sivakumar, Beaverton, OR (US); Kevin X. Zhang, Portland, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 13/169,864

(22) Filed: Jun. 27, 2011

(65) Prior Publication Data
US 2012/0326218 A1 Dec. 27, 2012

(51) Int. Cl.
*H01L 27/108* (2006.01)
(52) U.S. Cl.
USPC .......... 257/298; 257/401; 257/E27.084; 438/241
(58) Field of Classification Search
USPC .......... 257/296, 298, 401, E27.084; 438/241
See application file for complete search history.

(56) References Cited

U.S. PATENT DOCUMENTS

| 6,545,904 | B2 | 4/2003 | Tran | |
|---|---|---|---|---|
| 7,139,184 | B2 * | 11/2006 | Schloesser | 365/53 |
| 7,183,603 | B2 * | 2/2007 | Park | 257/298 |
| 7,642,572 | B2 * | 1/2010 | Popp et al. | 257/211 |
| 8,309,450 | B2 * | 11/2012 | Ohashi | 438/592 |
| 2008/0055958 | A1 * | 3/2008 | Takemura et al. | 365/63 |

OTHER PUBLICATIONS

Kujirai, et al, "Data Retention Time in DRAM with WSix/P+ poly-Si Gate NMOS Cell Transistors," IEEE (2001), IEDM 01-395 to 01-398, 4 pages.
Aoki, et al., "Fully Self-Aligned 6F² Cell Technology for Low Cost 1Gb DRAM," 1996 Symposium on VLSI Technology Digest of Technical Papers (1996), pp. 22-23.

* cited by examiner

*Primary Examiner* — Tuan N. Quach
(74) *Attorney, Agent, or Firm* — Blakely, Sokoloff, Taylor & Zafman LLP

(57) ABSTRACT

A $6F^2$ DRAM cell with paired cells is described. In one embodiment the cell pairs are separated by n-type isolation transistors having gates defining dummy word lines. The dummy word lines are fabricated from a metal with a work function favoring p-channel devices.

11 Claims, 5 Drawing Sheets

6F2 DRAM CELL

FIELD OF THE INVENTION

The invention relates to dynamic random access memory (DRAM) cells.

PRIOR ART

Integrated circuit transistors are often isolated from one another with oxide regions. Two common techniques for forming these regions are: (i) the local oxidation of silicon (LOCOS) using openings in a silicon nitride layer, and (ii) shallow trench isolation (STI) where shallow trenches are filled with oxide. Neither is easily scaled and careful layout is required to realize DRAM cells with an area of $8F^2$ or smaller.

U.S. Pat. No. 6,545,904 describes a $6F^2$ DRAM cell where isolation is obtained from a combination of isolation transistors and STI. The gate oxide in the isolation transistors is thicker than the oxides used in the DRAM access transistors providing greater isolation.

P+ polysilicon gates for n-channel access transistors and isolation transistors are suggested as another method to achieve $6F^2$ DRAM cells. See "Data Retention Time in DRAM with WSix/P+ ply-Si Gate NMOS Cell Transistors," by Hiroshi Kiuirai et al. *Electronic Devices Meeting*, 2001, *IEDM Technical Digest International*, beginning at page 395. Another technique for $6F^2$ DRAM cells in a bit-line overcapacitor cell using LOCOS and isolation transistors is described in "Fully Self-Aligned $6F^2$ Cell Technology for Low Cost 1 Gb DRAM," by Masami Aoki et al. 1996 *Symposium on VLSI Technology Digest of Technical Papers*, beginning on page 22.

DETAILED DESCRIPTION

In the following description $6F^2$ DRAM cells are described. Numerous specific details are set forth in order to provide a thorough understanding of the cells and their use in an array such as the capacitor contact structure of FIG. 3. It will be apparent to one skilled in the art that these specific details are but one way to achieve the claimed memory. In other instances, well-known processes for fabricating DRAM cells are not described in detail in order not to unnecessarily obscure the present invention.

The described cells are particularly useful for embedded DRAMs since they are compatible with logic CMOS technology.

Figure 1:
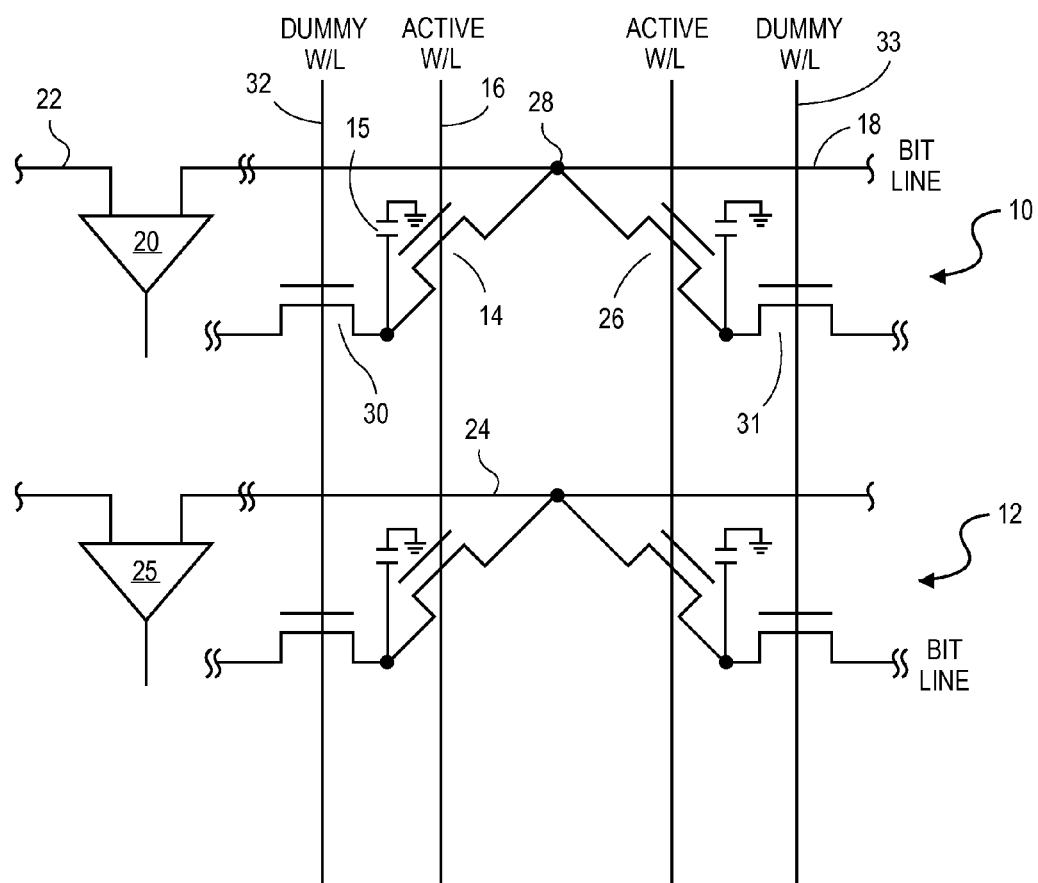
FIG. 1 is an electrical schematic illustrating paired dynamic random access memory (DRAM) cells laid out in accordance with one embodiment of the present description.

In FIG. 1, two pairs of cells 10 and 12 are illustrated. Each cell comprises an access transistor and capacitor such as transistor 14 and capacitor 15. A source/drain region of the access transistor 14 is connected to an overlying bit line 18 by contact 28. One cell in each pair of cells is accessed by the potential on word line 16. Each bit line is connected to one input of a sense amplifier such as sense amp 20; the other input of sense amp 20 is connected to a bit line 22 extending over another portion of a DRAM array. Similarly, the pair of cells 12 is connected to a bit line 24 providing one input to the sense amp 25.

The channel regions of the access transistors 14 and 26 are angled with respect to the bit lines and word lines. As will be seen in FIG. 2 this reduces the horizontal dimension of the cell pairs and more readily facilitates a single contact 28 to the overlying bit line 18 for a cell pair.

Isolation between each cell pair and its neighboring cell pairs (along a given bit line) is obtained through isolation transistors, such as transistors 30 and 31 of FIG. 1. The gates of these transistors define dummy word lines such as lines 32 and 33 of FIG. 1. These dummy word lines are fabricated in a replacement gate process from a metal with a work function favoring a p-type device even though the source/drain regions for the transistors 30 and 31, as well as the source/drain regions of the access transistors 14 and 26, are all n-type regions. The access transistors have metal gates with a work function favoring n-type devices. The cells for the layout of FIG. 2 have an effective area of $6F^2$ and are fabricated with a logic-based fabrication process.

Here, F is defined as one-half the minimum pitch, with minimum pitch being the minimum line width plus the width of a space immediately adjacent the line on one side of the line and the next adjacent line in a repeated pattern. For the layout of FIG. 2, bit lines are in a horizontal direction and word lines are in a vertical direction. The bit lines are on a 2F half-metal pitch. Each cell's horizontal dimension is on a 1.5 gate pitch or 3F half-gate pitch. This yields a cell area of $6F^2$.

Figure 2:
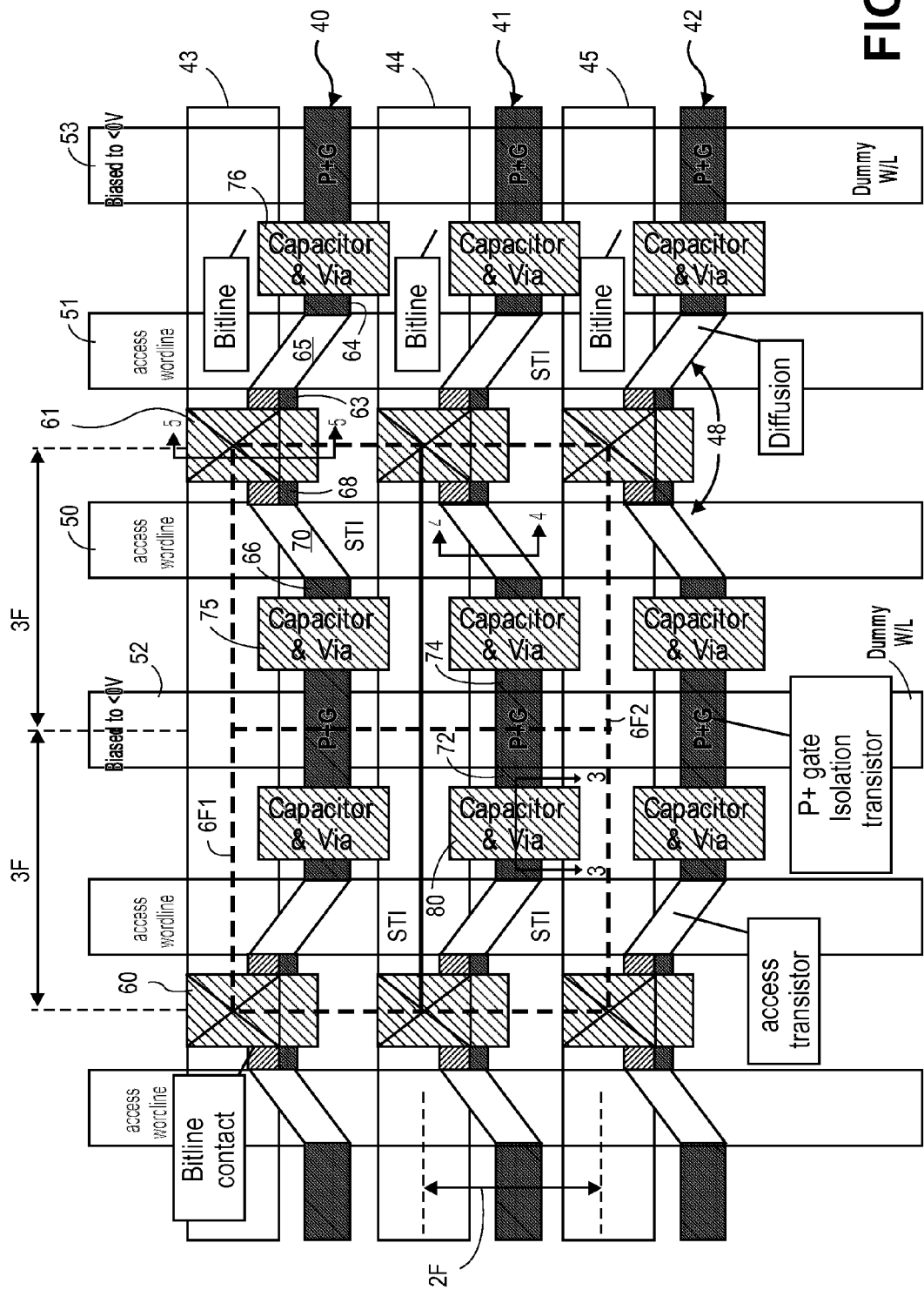
FIG. 2 is a plan view of the cell pairs showing their contacts to overlying bit lines and overlying capacitors.

The layout of FIG. 2 can be fabricated on a bulk silicon substrate or on a silicon-on-insulator (SOI) substrate. In one embodiment serpentine shaped fin-like, semiconductor bodies 40, 41 and 42 are etched from a p-type bulk silicon substrate, each of the bodies 40, 41 and 42 are generally parallel to an adjacent bit line such as bit lines 43, 44 and 45, respectively. The continuous bodies, such as body 42, include "lambda" shaped segments formed at, for instance, the regions 48 of body 42. The bodies 40, 41 and 42 include the n-type source/drain regions for both the access transistors and isolation transistors as well as the channel regions for these transistors. It should be noted that while raised bodies are used in a tri-gate process for one embodiment, this is not necessary to the layout, for instance the source/drain and the channel regions defined therebetween can be formed directly in a bulk silicon.

STI regions are formed in the horizontal direction between the lines 40, 41 and 42. And as mentioned, vertical isolation between cells pairs is provided by the isolation transistors which are defined at the intersection of the semiconductor bodies and the vertically disposed dummy word lines such as dummy word lines 52 and 53 of FIG. 2. Each pair of cells is isolated from a neighboring pair of cells along a given silicon body, such as body 40, by isolation transistors disposed on opposite sides of the cell pairs. Each of the isolation transistors includes a source/drain region such as regions 72 and 74 with a channel region defined therebetween. The access word lines, such as word lines 50 and 51, are formed between the dummy word lines 52 and 53 defining gates for the access transistors.

The generally horizontally disposed bit lines, such as bit lines 43, 44 and 45 are metal lines formed in, for instance, a metal 1 layer disposed above the substrate generally perpendicular to the word lines. All the access transistors associated with a given bit line (e.g. the access transistors formed along body 40 for bit line 43) have via contacts, such as contacts 60 and 61, so that a source/drain region from each access transistor in a pair of access transistors is connected to the bit line through a single via contact. Consequently the access transistor with the source/drain regions 63 and 64 (defining the angled channel region 65) as well as the access transistor with the source/drain regions 66 and 68 (defining the angled channel region 70) are connected to the word line 43 through the common via contact 61.

The other source/drain region of each access transistors is connected to a capacitor by a contact via, such as contacts 75 and 76. As will be seen best from FIG. 3, the capacitor over bit line (COB) layout facilitates the $6F^2$ cell size and also eliminates the need for substrate level processing steps not necessarily compatible with a logic process that would otherwise be needed where substrate regions are used in the formation of a capacitor.

All the source/drain regions for the layout of FIG. 2 are n+ regions. Consequently, both the access transistors and isolation transistors are n channel devices. However, the metal lines defining the gates for the isolation transistors comprise a material favoring a p-type device, more specifically a metal with a work function between approximately 4.8 to 5.1 eV. In contrast, the access word lines defining the gates of the access transistors are fabricated from a metal with a work function favoring n-type devices, more specifically a metal with a work function between approximately 4.0 to 4.2 eV.

In one embodiment, the dummy word lines are maintained at a potential less than zero volts (relative to zero volts of the substrate). Also, the access word lines, when not selecting a column of access transistors, are maintained at this same potential of less than zero volts. Word line selection which may be used for the layout of FIG. 2 is described in "NOR Word Line Selection," application Ser. No. 12/928,989, filed Dec. 22, 2010, and "NAND Logic Word Line Selection," application Ser. No. 12/928,949, filed Dec. 22, 2010, now U.S. Pat. No. 8,456,946. A hierarchical DRAM sensing arrangement that may be used with the array of FIG. 2 is described in "Hierarchical DRAM Sensing," application Ser. No. 12/928,948, filed Dec. 22, 2010, now U.S. Pat. No. 8,406,073. All three of the above-referenced applications are assigned to the assignee of the present application.

Figure 3:
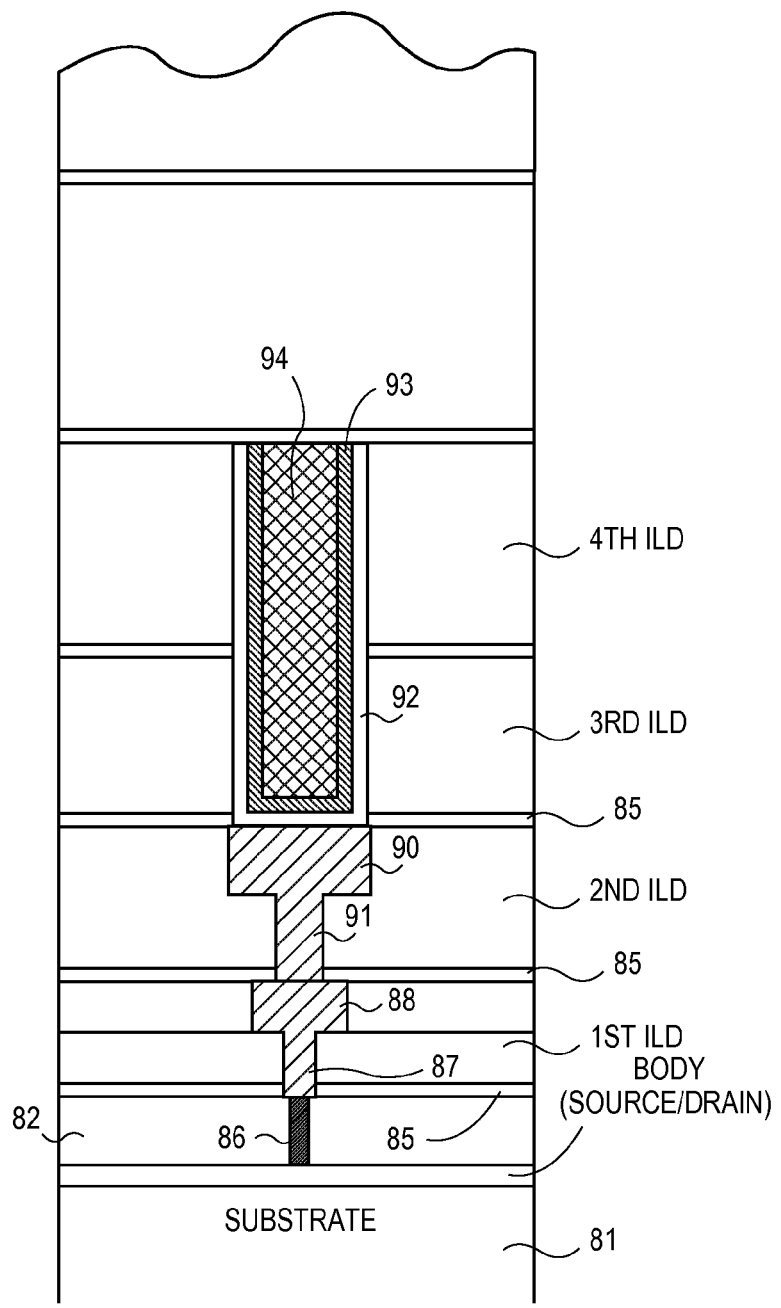
FIG. 3 is a cross-sectional, elevation view of a capacitor contact and overlying capacitor taking generally through section lines 3-3 of FIG. 2.

In FIG. 3 a capacitor and via contact for a single DRAM cell is shown in a cross-sectional view. A semiconductor substrate 81 includes an integral body having a source/drain region beneath the via contact 86. Contact 86 is surrounded by an insulator, sometimes referred to as the 0 level interlayer dielectric (ILD). In the first level ILD the via contact comprises the plug 87 (for instance a tungsten plug) extending from the contact 86 to the damascene copper inlay 88. Note there is an opening formed through the etchant stop layers 85 which separates each of the ILD layers for contact to an underlying layer. Again in the second ILD, the via contact comprises a plug 91 with an overlying damascene copper inlay 90. The capacitor is formed in the ILD layers 3 and 4 for the illustrated embodiment. It includes a first plate 92 which makes contact with the underlying inlay 90. An insulator 93 insulates the plate 92 from the inner, second, plate 94. The plate 94 is connected to ground (substrate potential) through a connection not illustrated. Note that at each higher ILD level the line spacing increases. However, there is sufficient spacing between the capacitors for the illustrated embodiment to allow the fabrication of the cells within the $6F^2$ area for this COB cell. The fabrication of the capacitor is described in co-pending application Ser. No. 13/041,170, filed on Mar. 4, 2011, assigned to the assignee of the present application.

Figure 4:
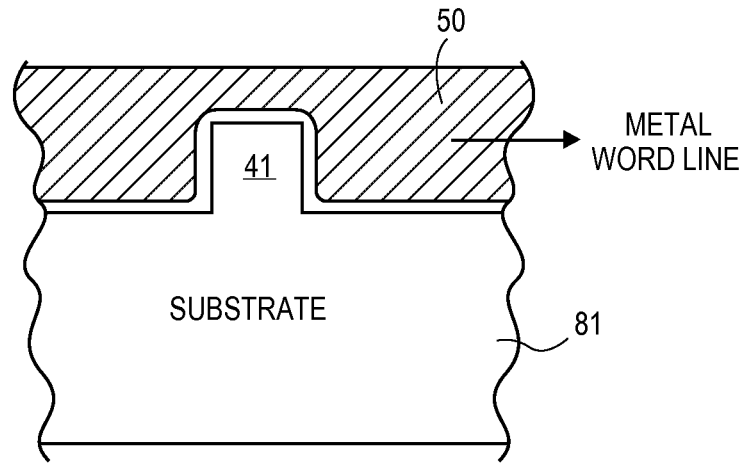
FIG. 4 is a cross-sectional, elevation view of a metal word line forming a gate for an access transistor taken generally taken through section line 4-4 of FIG. 2.

FIG. 4, taken through section line 4-4 of FIG. 2, shows a semiconductor body, such as body 41 of FIG. 2, and an overlying metal word line 50 insulated from the body as is typically the case with field-effect transistors. In one process for fabricating the array of FIG. 2, the word lines are initially formed from a sacrificial polysilicon layer and then after the source/drain regions for the transistors are doped in alignment with the sacrificial gate, a replacement gate process is used to replace the polysilicon with the metal word line. For FIG. 4 the metal word line 50 is one that has a work function favoring n-channel devices.

Figure 5:
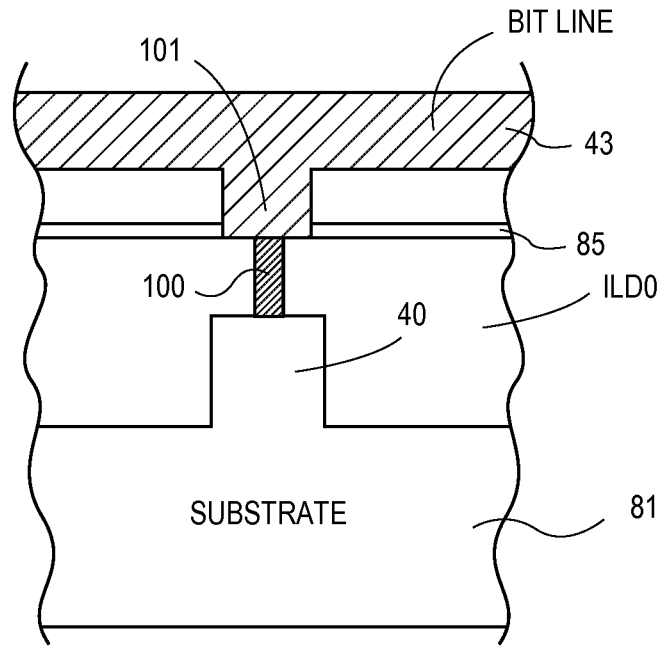
FIG. 5 is a cross-sectional, elevation view illustrating the contact to a bit line from an underlying source/drain region of an access transistor.

FIG. 5, taken through section line 5-5 of FIG. 2, shows a contact from an overlying bit line 43 to a semiconductor body 40 which is a source/drain region. This bit line is formed in the first metal layer. A contact 100 connects the bit line 43 and plug 101 to the body 40 (source/drain region) disposed between the two access transistors in the paired cell layout of FIG. 2. Once again an ILD 0 is shown along with an etchant stop layer 85.

Figure 6:
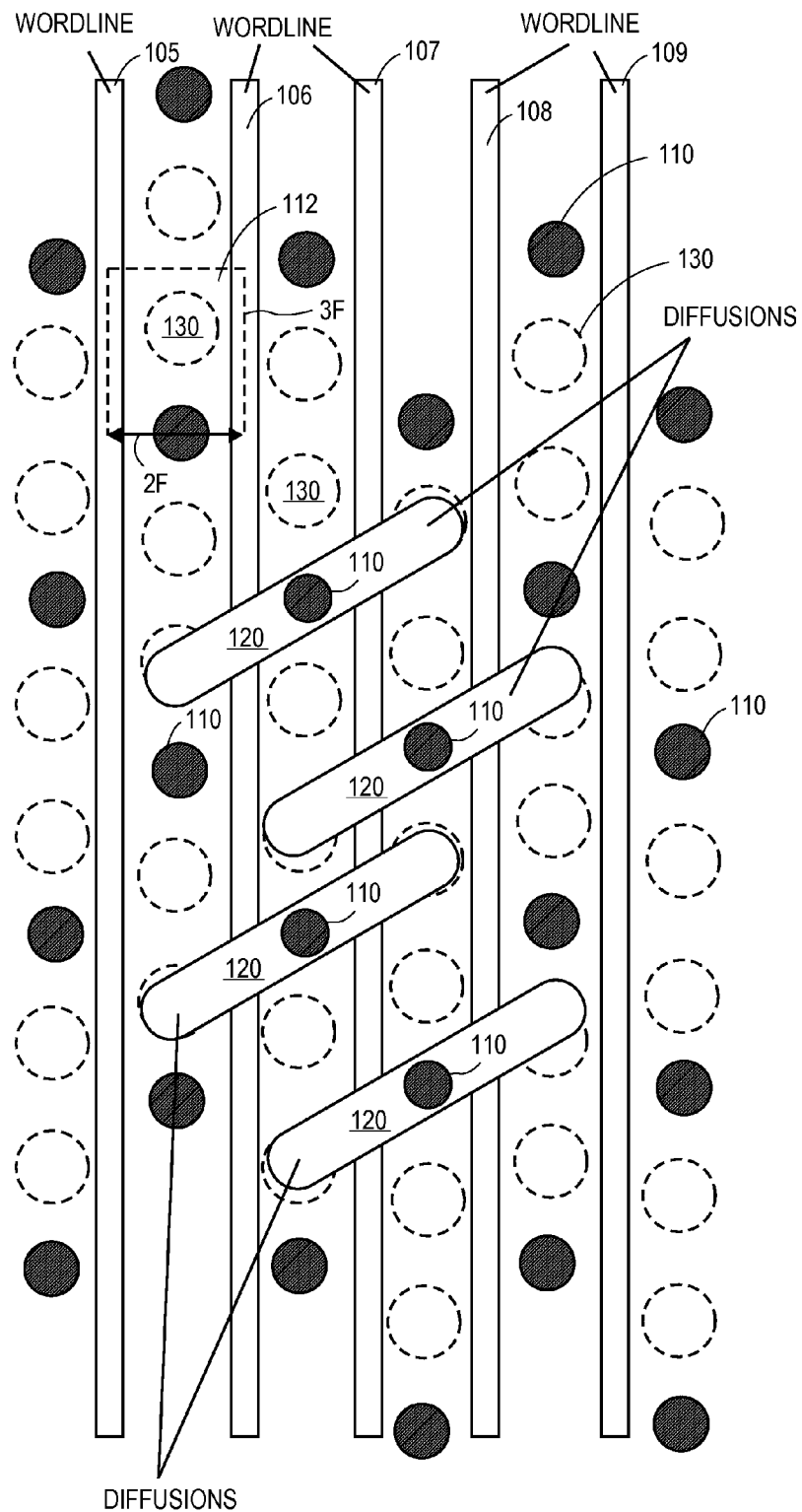
FIG. 6 is a plan view showing angled diffusions used in another embodiment where a $6F^2$ cell is realized without isolation transistors.

FIG. 6 is an alternate layout where the DRAM COB cells are organized as linear pairs without the dummy word lines. A single cell is shown within the regions 130. A pair of cells is formed in each of the diffusion zones 120. (Note that not all the diffusion zones 120 are shown.) The cells are paired in a linear arrangement without the serpentine body of FIG. 2. STI is used between each of the diffusions. All the diffusions for the cells occur at the same angle relative to the principal angles of the wafer. Consequently, a wafer is positioned in the same off-axis orientation for both channel implants and source/drain implants.

All the word lines shown in FIG. 6, specifically lines 105, 106, 107, 108 and 109 are access word lines. A word line is positive when selected and maintained at a negative potential when deselected. Bit lines are not shown but are disposed horizontally across the bit line contacts 110. Each cell pair shares a bit line contact 110 disposed midway between its cells.

As can be seen from the rectangular block 112, a cell has an area equal to $6F^2$, 3F of which runs in the word line direction for this embodiment and 2F extends from word line to word line such as from word lines 105 to 106.

Thus, DRAM layouts have been described where the cells are paired using a common bit line contact and where the cells have an area equal to $6F^2$.

What is claimed is:
1. A DRAM array comprising:
a pair of cells, each cell comprising an access transistor having n-type source/drain regions defining a channel region, and a capacitor, one source/drain region of each access transistor in a first pair of cells being connected to a common via contact providing a connection to a bit line, the other source/drain region of each access transistor being separated from other source/drain regions of access transistors of adjacent pairs of cells by common channel regions defined by the n-type source/drain regions;
access word lines extending generally perpendicular to the bit line, each access word line extending over a channel region of an access transistor, the access word lines comprising a material with a work function favoring n-channel devices; and dummy word lines extending generally perpendicular to the bit line, each dummy word line extending over one of the common channel regions, the dummy word lines comprise a material with a work function favoring p-channel devices.

2. The DRAM array of claim 1, wherein the work function for the dummy word lines is approximately 4.8-5.1 eV.

3. The DRAM array of claim 1, wherein the dummy word lines are coupled to a negative potential with respect to a substrate potential.

4. The DRAM array of claim 1, including via contacts connected to the other source/drain regions of the access transistors for providing a connection to overlying capacitors.

5. The DRAM array of claim 1, wherein the bit line is a metal line disposed above the pairs of cells in the array.

6. The DRAM array of claim 1, wherein the capacitors are disposed above the bit lines.

7. The DRAM array of claim 1, wherein the channel regions of the access transistors are angled with respect to their source/drain regions.

8. The DRAM array of claim 1, wherein the source/drain regions, access transistor channel regions, and common channel regions are formed from a continuous serpentine-shaped semiconductor body disposed generally perpendicular to the word lines.

9. The DRAM array of claim 1, wherein each cell has an area of approximately $6F^2$.

10. The DRAM array of claim 1, wherein the channel regions of the access transistors are angled with respect to their source/drain regions.

11. The DRAM array of claim 1, wherein the source/drain regions, access transistor channel regions, and common channel regions are formed from a continuous serpentine-shaped semiconductor body disposed generally perpendicular to the word lines.

* * * * *